United States Patent [19]

Foreman et al.

[11] Patent Number: 5,590,058
[45] Date of Patent: * Dec. 31, 1996

[54] BATTERY MONITOR FOR UNOBSTRUSIVE INSTALLATION WITH A BATTERY CONNECTOR

[75] Inventors: Kevin G. Foreman, Sandia Park; Paul J. Miller; Steven M. Siska, both of Albuquerque, all of N.M.

[73] Assignee: TRW Inc., Redondo Beach, Calif.

[*] Notice: The term of this patent shall not extend beyond the expiration date of Pat. No. 5,181,859.

[21] Appl. No.: 394,924

[22] Filed: Feb. 24, 1995

Related U.S. Application Data

[63] Continuation of Ser. No. 998,354, Dec. 30, 1992, abandoned, which is a continuation-in-part of Ser. No. 938,111, Aug. 31, 1992, Pat. No. 5,290,191, which is a continuation-in-part of Ser. No. 895,148, Jun. 5, 1992, Pat. No. 5,181,859, which is a continuation of Ser. No. 694,262, Apr. 29, 1991, abandoned.

[51] Int. Cl.$^6$ .................. G01R 15/00; G01R 19/155
[52] U.S. Cl. .................. 364/551.01; 364/483; 340/636; 429/93
[58] Field of Search .................. 364/551.01, 480, 364/481, 483; 429/90, 91, 92, 93; 324/426, 431, 433, 435, 437; 340/636, 656; 439/225

[56] References Cited

U.S. PATENT DOCUMENTS

| | | | |
|---|---|---|---|
| 2,073,880 | 3/1937 | Robinson | 439/325 |
| 2,385,620 | 9/1945 | Fleckenstein | 340/687 |
| 2,449,150 | 9/1948 | Schnoll | 340/656 |
| 2,760,128 | 8/1956 | Colby | 361/301 |
| 2,944,330 | 7/1960 | Swick | 428/572 |
| 3,072,873 | 1/1963 | Traher | 439/101 |
| 3,086,188 | 4/1963 | Ross . | |
| 3,231,843 | 1/1966 | Antes et al. | 439/109 |
| 3,234,464 | 2/1966 | Cook | 324/122 |

(List continued on next page.)

FOREIGN PATENT DOCUMENTS

| | | |
|---|---|---|
| 0149907 | 7/1985 | European Pat. Off. . |
| 0211508 | 2/1987 | European Pat. Off. . |
| 0348562 | 1/1990 | European Pat. Off. . |
| 8428300 | 2/1985 | Germany . |
| 0246305 | 1/1926 | United Kingdom . |

OTHER PUBLICATIONS

Pulse–Guard "Pulse–Guard Model 'PGD' Submillimeter Suppressor Arrays", 2 sheets date believed to be Oct. 1992 (Ex. E).
Pulse–Guard "The Super ESD Suppressor For I/O Connectors", 4 sheets, date believed to be Feb. 1993 (Ex. F).
Pulse–Guard "Transient Overvoltage Protection", 1 pg, date believed to be Mar. 1992. (Ex. C).
Hyatt, "A Technique for Optimizing ESD, EMP and Lightning Protection", pp. 393–408, date believed to be fall 1992. (Ex. B).
G & H Technology, Inc., "Pulse–Guard" literature including Sub–Millimeter model, 10 sheets, date believed to be Aug. 1992. (Ex. D).
Archer, "Heavy Duty Spike Protector". (Ex. A) No Date.

Primary Examiner—Emanuel T. Voeltz
Assistant Examiner—M. Kemper
Attorney, Agent, or Firm—G. Gregory Schivley; Robert W. Keller

[57] ABSTRACT

A device for monitoring the environment of a battery. The device takes the form of a generally flat wafer-like substrate having openings therein for receiving the posts of the battery. The device is arranged so that it is sandwiched between the battery and its connector when the female receptacles of the connector are mated with the posts. Circuitry on the wafer contains a memory for recording information about the battery characteristics. This information can be read from the memory to provide knowledge about battery operating time, number of charge/discharge cycles, number and severity of deep-discharge cycles, total time spent in deep discharge, temperature fluctuations and G-loads applied to the battery. By taking advantage of the existing space between mated battery connectors, no additional mounting hardware or battery modifications are required.

21 Claims, 3 Drawing Sheets

U.S. PATENT DOCUMENTS

| | | | |
|---|---|---|---|
| 3,271,726 | 9/1966 | Pfendler. | |
| 3,435,387 | 3/1969 | Reinke et al. | 333/183 |
| 3,500,194 | 3/1970 | Smith | 324/110 |
| 3,569,915 | 3/1971 | Langham et al. | 439/608 |
| 3,670,292 | 6/1972 | Tracy | 439/608 |
| 3,718,859 | 2/1973 | Arlow. | |
| 3,736,379 | 5/1973 | Kagan | 379/98 |
| 3,740,701 | 6/1973 | Harnden, Jr. | 338/220 |
| 3,753,261 | 8/1973 | Thaxton | 340/656 X |
| 3,790,858 | 2/1974 | Brancaleone et al. | 174/260 |
| 3,821,686 | 6/1974 | Harnden, Jr. | 338/21 |
| 3,825,874 | 7/1974 | Peverill | 439/579 |
| 3,852,700 | 12/1974 | Haws | 439/98 |
| 3,905,013 | 9/1975 | Lee | 340/457.2 |
| 4,002,397 | 1/1977 | Wang et al. | 439/225 |
| 4,029,386 | 6/1977 | Krantz, Jr. et al. | 439/608 |
| 4,056,299 | 11/1977 | Paige | 439/439 |
| 4,082,394 | 4/1978 | Gedney et al. | 439/69 |
| 4,089,032 | 5/1979 | Dell Orfano | 361/56 |
| 4,326,765 | 4/1982 | Brancaleone | 439/69 |
| 4,330,166 | 5/1982 | Cooper et al. | 439/609 |
| 4,362,350 | 12/1982 | von Harz | 439/608 |
| 4,407,552 | 10/1983 | Watanabe et al. | 439/608 |
| 4,415,218 | 11/1983 | McKenzie | 439/620 |
| 4,440,463 | 4/1984 | Gliha, Jr. et al. | 439/92 |
| 4,522,455 | 6/1985 | Johnson | 339/14 R |
| 4,580,866 | 4/1986 | Hagner | 439/621 |
| 4,673,237 | 6/1987 | Wadsworth | 439/607 |
| 4,676,564 | 6/1987 | Mitchell, Jr. | 439/77 |
| 4,709,253 | 11/1987 | Walters | 257/603 |
| 4,717,349 | 1/1988 | Johnson | 439/92 |
| 4,726,638 | 2/1988 | Farrar et al. | 439/620 |
| 4,729,743 | 3/1988 | Farrar et al. | 439/276 |
| 4,729,752 | 3/1988 | Dawson, Jr. et al. | 439/620 |
| 4,813,891 | 3/1989 | Walters et al. | 439/620 |
| 4,820,174 | 4/1989 | Farrar et al. | 439/95 |
| 4,846,705 | 7/1989 | Brunnenmeyer | 439/78 |
| 4,930,200 | 6/1990 | Brush, Jr. et al. | 29/25.42 |
| 4,949,046 | 8/1990 | Seyfang | 324/431 X |
| 4,979,070 | 12/1990 | Bodkin | 361/42 |
| 4,979,904 | 12/1990 | Francis | 439/608 |
| 4,992,061 | 2/1991 | Brush, Jr. et al. | 439/620 |
| 4,992,333 | 2/1991 | Hyatt | 428/402 |
| 5,092,788 | 3/1992 | Pristupa, Jr. et al. | 439/225 |
| 5,118,302 | 6/1992 | Fussell et al. | 439/225 |
| 5,134,252 | 7/1992 | Himeno et al. | 174/268 |
| 5,149,274 | 9/1992 | Gallusser et al. | 439/76.1 |
| 5,153,540 | 10/1992 | Gliha, Jr. | 333/182 |
| 5,181,859 | 1/1993 | Foreman et al. | 439/225 |
| 5,183,698 | 2/1993 | Stephenson et al. | 428/209 |
| 5,257,950 | 11/1993 | Lenker et al. | 439/620 |
| 5,284,719 | 2/1994 | Landau et al. | 429/93 X |
| 5,290,191 | 3/1994 | Foreman et al. | 439/225 |

5,590,058

BATTERY MONITOR FOR UNOBTRUSIVE INSTALLATION WITH A BATTERY CONNECTOR

CROSS REFERENCE TO RELATED APPLICATIONS

This is a continuation of U.S. patent application Ser. No. 07/998,354, filed Dec. 30, 1992 (abandoned), which was a continuation in part of Ser. No. 07/938,111 filed Aug. 31, 1992, now U.S. Pat. No. 5,290,191, which was a continuation in part of Ser. No. 07/895,148, filed Jun. 5, 1992, now U.S. Pat. No. 5,181,859, which was a continuation of Ser. No. 07/694,262, filed Apr. 29, 1991 (abandoned).

BACKGROUND OF THE INVENTION

1. Technical Field

This invention relates to sensors and, more particularly, to a device for sensing characteristics of a battery.

2. Discussion

In many applications it would be desirable to sense the characteristics of a battery. This is especially true with batteries that are used to power equipment where it is essential that a reliable source of power is consistently maintained. For example, batteries used on many systems by the Department of Defense are being replaced with the latest technology high-reliability, maintenance-free batteries (HRMFB). While improvements in reliability and performance are expected from these new batteries, reliability engineers need to understand and quantify the actual gains to establish optimum maintenance intervals and number of required spares. Basing these decisions on real-life performance data, as opposed to educated guesses, will yield significant cost savings by reducing the work load on battery maintenance and avoiding having too many or too few spare batteries on the shelves. The devices may also provide a means for determining whether a failed battery was within warranty limits.

It is known that the environment to which the battery is exposed can shorten or prolong expected life. Factors having the greatest effect on battery reliability include operating time, number of charge/discharge cycles, number and severity (i.e. magnitude depth) of deep-discharge cycles, temperature fluctuations, and G-loads. Sensors are currently available to measure and record these parameters, but most of them require costly retrofit or redesign of the battery structure to enable the sensor to be installed. In most cases it is neither practical nor cost effective to hard-wire a sensor inside an aircraft battery. Because of these drawbacks, data on large numbers of batteries under real operating conditions are difficult to obtain.

The present invention is directed to solving one or more of these problems.

SUMMARY OF THE INVENTION

In accordance with the teachings of the present invention, a device is provided for obtaining information about battery characteristics, yet is easy to install. The device takes advantage of the existing space between the mated battery and its connector and non-intrusively monitors and records the battery environment. No additional mounting hardware or battery modifications are required. Preferably, the unit is entirely self-contained and is capable of recording environmental data onto a non-volatile memory.

In the preferred embodiment, the device takes the form of a generally flat wafer-like substrate having first and second openings therein for receiving the positive and negative posts of the battery. Circuitry carried by the substrate is used to detect characteristics of the battery. Conductive means are utilized to make electrical connection between the posts and the circuitry. The device is constructed so that it lies essentially parallel to the battery surface, with the posts extending through the openings in the wafer and making contact with the conductive means.

In use, the device is sandwiched between the surface of the battery and the connector when the female receptacles therein are mated with the posts to supply power to electrical apparatus during normal operating conditions.

BRIEF DESCRIPTION OF THE DRAWINGS

The various advantages of the present invention will become apparent to those skilled in the art after reading the following specification and by reference to the drawings in which.

DESCRIPTION OF THE PREFERRED EMBODIMENT

Figure 1:
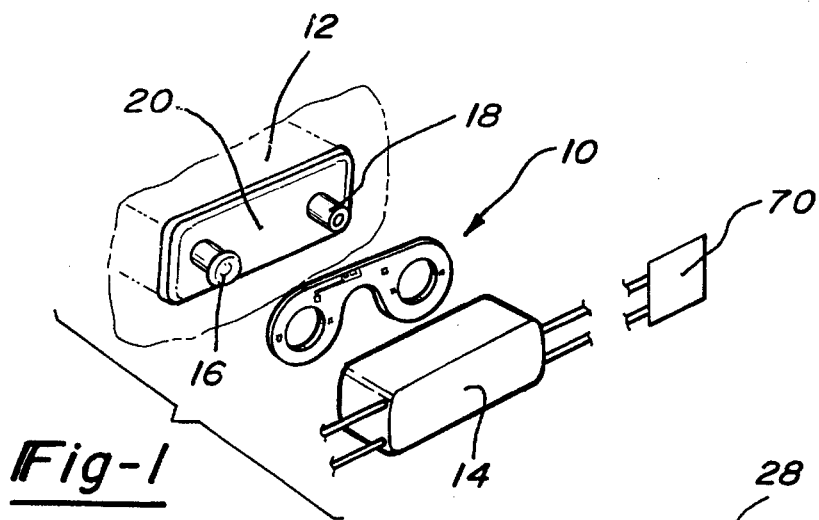
FIG. 1 is an exploded perspective view of the operable arrangement between the battery, connector and the battery sensing device of this invention.
Figure 2:
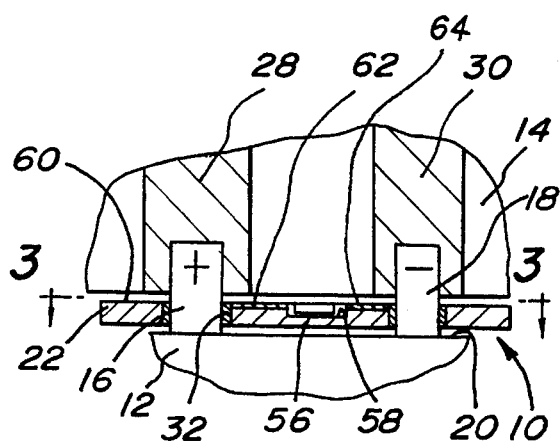
FIG. 2 is a cross-sectional view showing the battery sensing device sandwiched between the connector and battery during normal operation.

FIGS. 1 and 2 illustrate the battery sensor wafer device 10 of the present invention, a battery 12 and a battery connector 14. A positive battery post 16 and a negative battery post 18 extend from a major surface 20 of the battery 12. The present invention can be used with a wide variety of different battery designs. However, it finds particular utility for use with high-reliability, maintenance-free batteries (HRMFB) which are used on aircraft such as B-52's. In these applications it is of utmost importance that the batteries consistently provide the necessary power for the aircraft electronic systems. The present invention has the capability of sensing and recording pertinent battery reliability data under actual operating conditions. Reliability engineers can use this information to analyze different battery designs and to more precisely pinpoint when replacement of the battery is needed.

Figure 3:
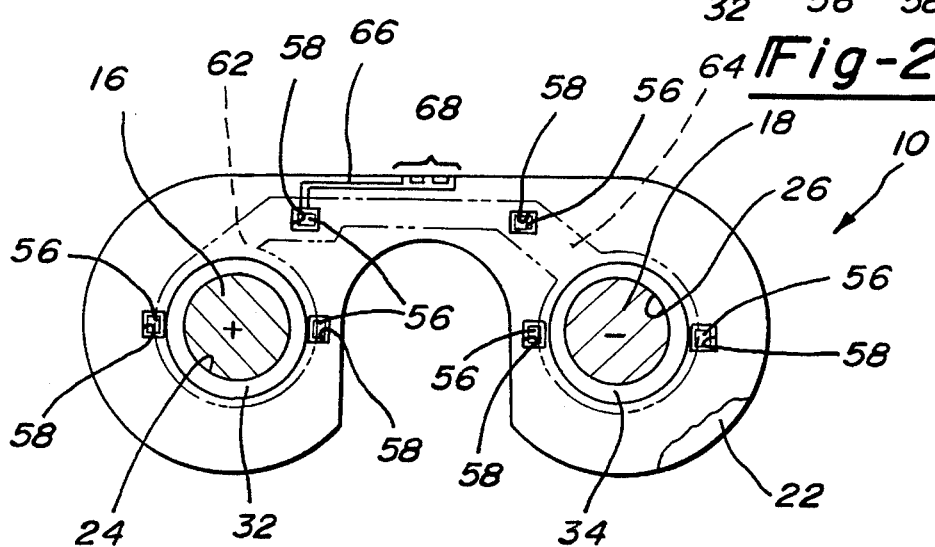
FIG. 3 is an enlarged plan view of the preferred embodiment of the battery sensing device.

With additional reference to FIG. 3, the battery sensor device 10 includes a thin, generally flat substrate 22. Substrate 22 has two holes 24 and 26 therein that are aligned with the positive battery post 16 and negative battery post 18, respectively. Device 10 is designed so that it can be slipped over the battery posts 16 and 18 such that it lies essentially flush against the battery end face 20 as shown in FIG. 2. Device 10 is sufficiently thin that it does not impede the normal mating connection with the connector 14. As seen in FIG. 2, the connector 14 typically includes female receptacles 28 and 30 that receive posts 16 and 18, respectively. Connector 14 can be a standard ELCON battery connector.

Contacts 32 and 34 on device 10 make electrical contact with posts 16 and 18, respectively. In this example, contacts 32 and 34 are shown as conductive layers lining the sidewalls of the substrate 22 defining holes 24 and 26, respectively. Other contact constructions such as bendable fingers could, of course, also be used.

Substrate 22 contains one or more devices for detecting characteristics of the battery during operation. Preferably, the present invention utilizes the circuitry shown in FIG. 4 for sensing, recording and transmitting battery information. The sensors include current sensors 40 for sensing the current supplied from the battery 12. Suitable current sensors are available from Honeywell utilizing magneto-resistive technology. Temperature sensors 42 are employed to sense the ambient temperature to which the battery is exposed during use. Suitable temperature sensors include thermistors available from Honeywell. Voltage sensors 44 serve to sense the voltage supplied by battery 12. The voltage sensors are simple resistive dividers, whose voltage is read directly by the signal conditioning circuitry.

A real time clock and random access memory (RAM) 46 are also used in this particular embodiment. The real time clock is used to provide suitable clock signals for tagging events with the time of their occurrences. The functions of the clock and RAM can be provided, for example, by Part No. MCC146818 from Motorola.

The sensors 40, 42, 44 and clock/RAM 46 are fed into suitable signal conditioning circuitry 48. Signal conditioning circuitry 48 provides the necessary signal conditioning to interface the aforementioned components with microprocessor 50. Typically, signal conditioning circuitry 48 includes analog to digital converters and the like for converting analog signals from the sensors to digital data for use with the microprocessor 50. A commercially available example of suitable signal conditioning circuitry is the Tile Array signal conditioning circuitry available from Exar as Beta 180. Microprocessor 50, in this example, includes 12 kilobytes of read only memory (ROM) and is available from Motorola as component No. MCC68HC711. A non-volatile memory 52 serves to record and permanently store information. For example, microprocessor 50 can be used to create tables in memory 52 which record the current levels supplied by battery 12 per unit time. In other words, the microprocessor 50 stores information generated by the current sensor 40 on a timed basis provided by clock 46 and stores it in memory 52. Likewise, temperature and voltage data can be stored in memory 52. In this example, non-volatile memory 52 can be a 16 kilobyte memory provided by Xicor as component No. X28C64H.

The recorded battery information can be read from memory 52 through an output port provided by an RS-232 serial interface translator 54 which is available from Harris Semiconductor as ICL232.

Figure 4:
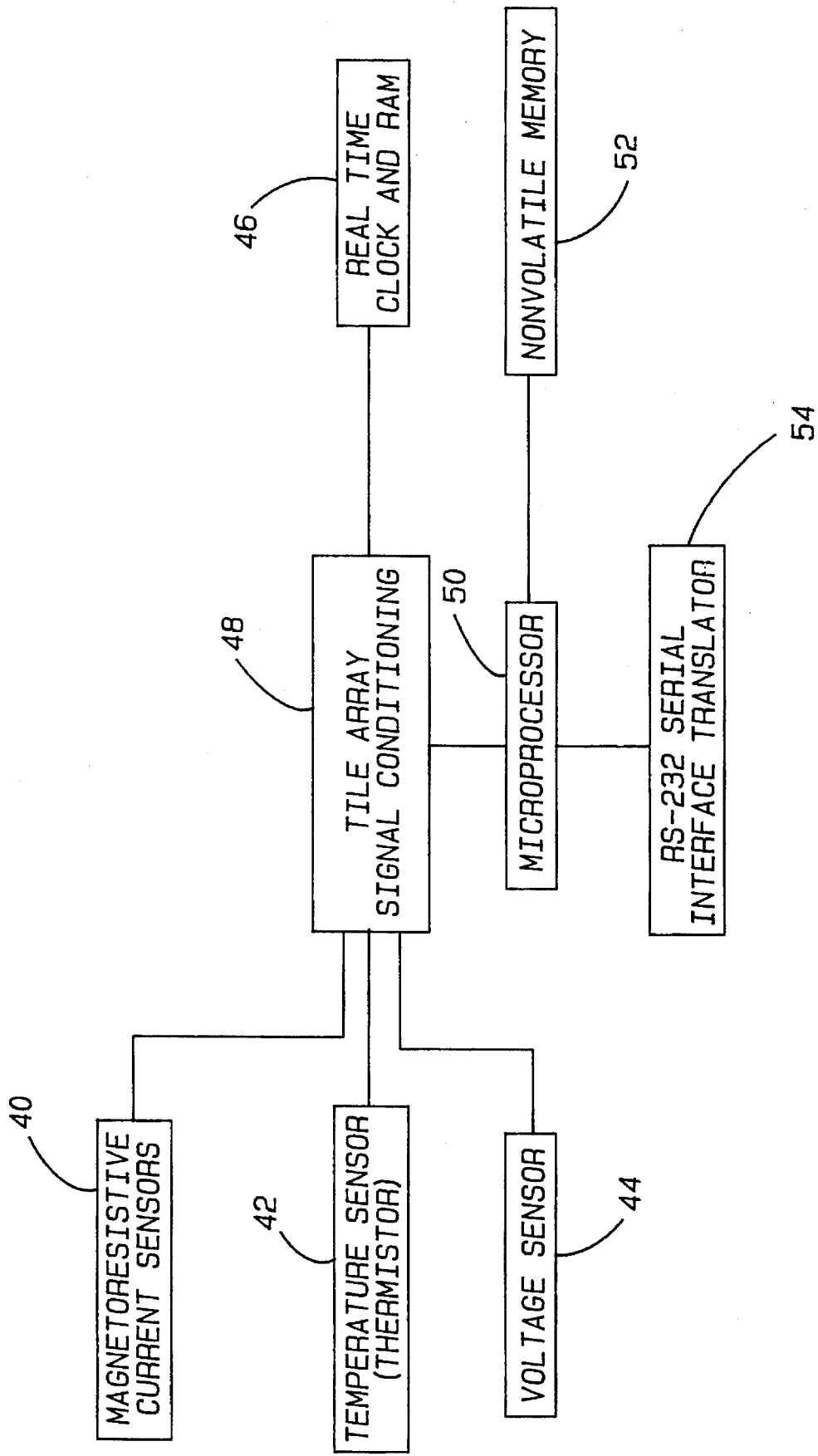
FIG. 4 is a schematic block diagram of the circuitry for sensing the battery characteristics.

The components making up the battery monitoring circuitry of FIG. 4 can be suitably arranged on the substrate 22 so as not to impede the normal connector-battery connection. In FIGS. 2 and 3 the circuitry components are generally indicated by the reference numeral 56. Components 56 are located in pockets 58 in the upper surface 60 of substrate 22. Components 56 thus do not appreciably extend above the surface 60. Electrical connection to the components 56 are made by traces on substrate surface 60. For example, trace 62 extends from positive battery post contact 32 to the pocket 58 and makes electrical connection with an appropriate component 56 (e.g., voltage sensor 44). Similarly, trace 64 extends from negative battery contact 34 to the voltage sensor to thereby monitor the voltage supplied via posts 16, 18 to the electrical equipment during use. It will be appreciated that, depending upon the degree of sophistication, more than one trace may be required and that the components 56 can be placed at various locations on substrate 22. The components, such as integrated circuit dies, are connected, for example, by conventional wire bonds between the die and the termination of the traces. A glob topcoating or other protective measures can be placed over the die, if desired. The top and bottom surfaces of the substrate 22 can also be covered with a suitable Kapton protective layer (not shown).

Trace(s) 66 extends from the component serving as a serial interface translator to an input/output port 68. Port 68 is suitably located near an edge of substrate 22 to receive an external connector, as will appear. A suitable power converter (not shown) is also preferably employed to take power from the battery post and convert it to levels suitable for powering the various components 56 such as microprocessor 50. An auxiliary backup battery may also be employed, if desired.

By way of non-limiting, yet specific examples, substrate 22 is a phenolic, nonconductive circuit board which is approximately 0.020 to 0.060 inch thick. In order to provide for proper mating with connector 12, the thickness of wafer 10 should be less than about 15 percent of the length of battery posts 16 and 18.

In operation, the device 10 is slipped over the battery posts 16 and 18 so that they extend through holes 24 and 26, with the substrate 22 lying essentially flush against battery end face 20. Connector 14 is then mated, in the normal fashion, with posts 16 and 18 to provide power to the electrical equipment which is schematically illustrated by box 70 in FIG. 1. As the battery is used to power equipment 70, the sensors 40, 42 and 44 continually provide information about the battery characteristics. This information can provide, for example, the number of charge/discharge cycles, the number and severity of deep-discharge cycles, total time spent in deep-discharge, and temperature fluctuations. Shock sensors and other similar sensors (not shown) could also be used to detect other operating environments such as the G-loads supplied to the battery. Microprocessor 50 can be suitably programmed to perform the desired data manipulation functions via input/output port 68.

Figure 5:
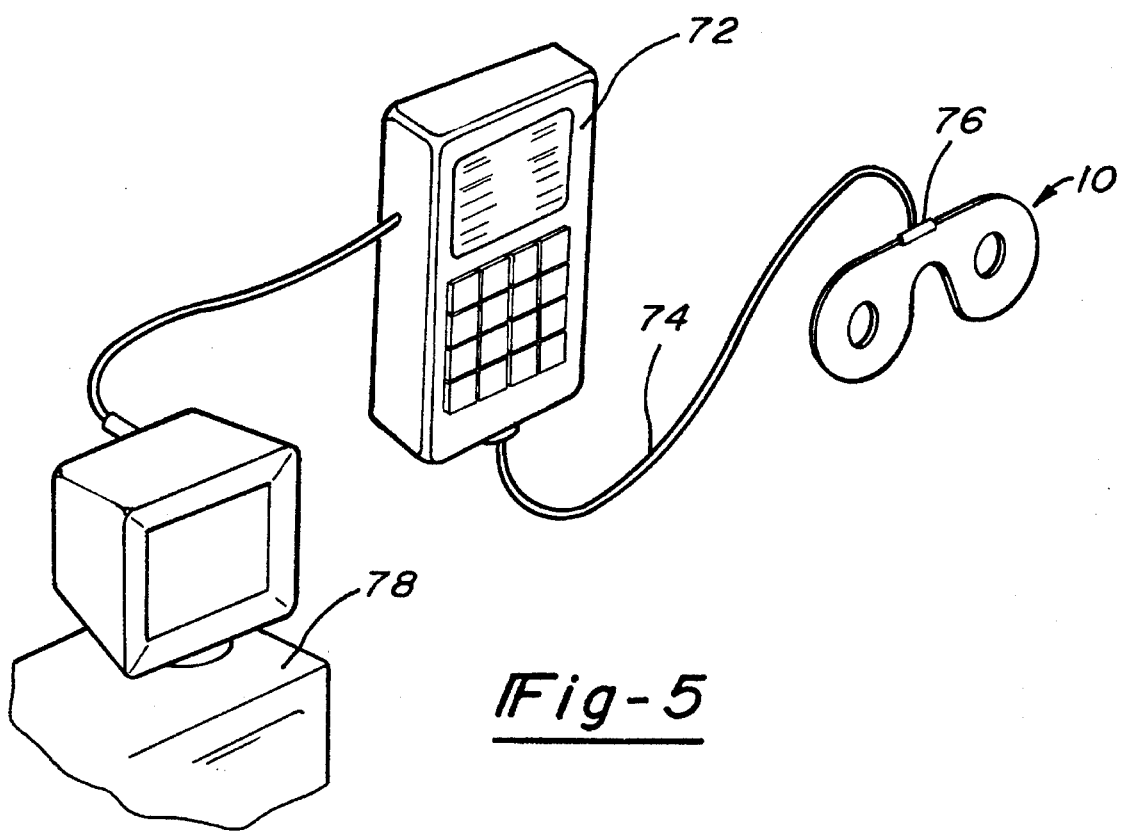
FIG. 5 is a view showing a hand-held controller reading information from the battery sensing device, with the controller being also coupled to a computer.

The information stored in memory 52 is easily read from device 10. As shown in FIG. 5, a hand-held data collector 72 includes a cord 74 having a suitable connector 76 on one end thereof which slides over the edge of device 10 to make electrical contact with the traces of input/output port 68. Data can be read from memory 52 in a known manner so that the stored information is transmitted to data collector 72. If desired, the hand-held data collector 72 can later transmit this information to a larger computer 78 for further analysis. Collection of the data can be obtained without removing the sensor from the battery. All that is needed is to remove the connector 14 and make electrical connection with the input/output port 68. Alternatively, the sensor could be hard-wired to computer monitoring systems on the vehicle carrying the battery or other read-out devices.

It should be understood that while this invention has been described in connection with a particular example thereof, no limitation is intended thereby since obvious modifications will become apparent to those skilled in the art after having the benefit of studying the foregoing specification, drawings and following claims.

What is claimed is:

1. A wafer-like device for sensing characteristics of a battery having a positive post and a negative post extending from a surface thereof, said device comprising:

a generally flat substrate having first and second openings therein for receiving the positive and negative posts of the battery;

sensor means carried by the substrate for detecting characteristics of the battery;

port means carried by the substrate for providing a connection to external equipment for transmitting information detected by the sensor means;

conductive means for making electrical connection between the posts and at least the sensor means; and said device being constructed so that it is insertable over the posts of the battery such that it lies essentially parallel to the battery surface with the posts extending through the openings in the substrate and making contact with the conductive means.

2. The device of claim 1 wherein the battery provides power to electrical apparatus by way of a connector having first and second female receptacles which fit over the positive and negative battery posts; and wherein the device is sandwiched between the surface of the battery and the connector when the female receptacles are mated with the posts.

3. The device of claim 1 which further comprises: memory means coupled to the sensor means for storing information about the characteristics of the battery.

4. The device of claim 3 wherein the port means is located near an edge of the wafer for mating with a connector coupled to the equipment for reading the information from the memory.

5. The device of claim 1 wherein the sensor means is selected from the group of sensors including:

current sensor means for sensing the current supplied by the battery;

voltage sensor means for sensing the voltage supplied by the battery; and temperature sensor means for sensing the temperature to which the battery is exposed.

6. The device of claim 5 which further comprises:

clock means for providing timing signals; and microprocessor means, coupled to at least one sensor and to the clock means, for storing sensor information on a timed basis in the memory.

7. The device of claim 1 wherein the conductive means comprises:

a first conductive pattern surrounding the first opening for making electrical contact with the positive battery terminal;

a second conductive pattern surrounding the second opening for making electrical connection to the negative battery post; and a conductor pattern on the substrate connecting the first and second conductive patterns to the sensor means and the port means.

8. The device of claim 1 wherein the substrate has a thickness of less than about 15% the length of the battery posts.

9. The device of claim 1 wherein the port means receives a connector from a hand-held data collection device.

10. A wafer-like device for sensing operating characteristics of a battery having a positive post and a negative post extending from a surface thereof, with the battery providing power to electrical equipment by way of a connector having first and second female receptacles which fit over the positive and negative battery posts, said device comprising:

a generally flat substrate having first and second openings therein for receiving the positive and negative posts of the battery;

at least one electrical component carried by the substrate;

sensor means, including the component, for sensing characteristics of the battery during use thereof;

real time clock means for providing timing signals;

memory means for storing the characteristics of the battery on a timed basis;

an input/output port means carried by the substrate for providing a connection for transmitting information about the characteristics of the battery;

first contact means for making electrical connection to the positive battery post;

second contact means for making electrical connection to the negative battery post;

conductive traces on the substrate for making electrical connection between the first and second contact means and at least the one component;

said device being insertable over the posts of the battery with the posts extending through the openings in the substrate and making contact with the first and second electrical contact means; and said device being sufficiently thin so as to fit between adjacent faces of the battery and the connector while permitting the posts to mate with the receptacles of the connector, whereby the device uses the sensor means in conjunction with the clock means and the memory means for monitoring and recording characteristics of the battery during use thereof.

11. The device of claim 10 which further comprises:

an external data collection device, coupled to the input/output port means, for reading information stored in the memory.

12. The device of claim 11 which further comprises a microprocessor which is programmable through the input/output port.

13. The device of claim 10 which includes sensors selected from the group of:

magneto-resistive current sensors, temperature sensors and voltage sensors.

14. The device of claim 10 wherein the substrate has a thickness of less than about 15% of the length of the battery posts.

15. The device of claim 10 wherein the substrate is a printed circuit board.

16. The device of claim 10 wherein the substrate has at least one pocket formed in a surface of the substrate and at least one electrical component in the pocket.

17. A method for sensing characteristics of a battery having first and second posts extending from a surface of the battery, said method comprising:

providing a wafer-like substrate having first and second holes therein corresponding to the first and second posts;

providing a first conductive pattern surrounding the first hole for making removable sliding electrical contact with the first post;

providing a second conductive pattern surrounding the second hole for making removable sliding electrical contact with the second post;

providing at least one sensor means on the substrate for sensing characteristics of the battery during use;

providing at least one memory means on the substrate for storing data about the battery during use;

providing an input/output port on the substrate;

providing conductive traces on the substrate for making electrical connection between the first and second conductive patterns, the sensor means, the memory means, and the input/output port;

inserting the wafer-like substrate over the posts with the first and second conductive patterns making removable sliding contact with the posts as the posts extend through the openings in the device;

mating a connector with the battery posts, with the substrate being sufficiently thin so as to fit between adjacent faces of the battery and the connector;

using the sensor means to sense characteristics about the battery;

storing data in the memory means about the sensed characteristics;

removing the connector from the battery posts;

removing the device from the battery posts; and reading the stored data through the input/output port carried by the substrate: whereby information about the battery during use can be obtained.

18. The method of claim 17 which further comprises:

providing a microprocessor on the substrate; and programming the microprocessor through the input/output port.

19. The method of claim 17 which further comprises:

using power from the battery posts to supply power to the microprocessor.

20. The method of claim 17 wherein the sensor means serves to sense one of the following characteristics: current, voltage or temperature.

21. The method of claim 17 wherein the data is stored along with the time at which the data was sensed.

* * * * *